United States Patent
Vögerl et al.

(10) Patent No.: US 9,743,563 B2
(45) Date of Patent: Aug. 22, 2017

(54) CONTROL APPLIANCE FOR USING IN THE ENGINE COMPARTMENT OR IN THE TRANSMISSION OF A MOTOR VEHICLE AND COOLING SYSTEM FOR SUCH A CONTROL APPLIANCE

(71) Applicant: Conti Temic Microelectronic GmbH, Nürnberg (DE)

(72) Inventors: Andreas Vögerl, Parsberg (DE); Gerhard Bauer, Gräfenberg (DE); Jürgen Henniger, Erlangen (DE); Uwe Trenner, Nürnberg (DE); Helmut Karrer, Fürth (DE); Alexander Wenk, Burgoberach (DE); Marion Gebhardt, Gräfenberg (DE)

(73) Assignee: Conti Temic Microelectronic GmbH, Nuremberg (DE)

( * ) Notice: Subject to any disclaimer, the term of this patent is extended or adjusted under 35 U.S.C. 154(b) by 189 days.

(21) Appl. No.: 14/714,851

(22) Filed: May 18, 2015

(65) Prior Publication Data

US 2016/0021796 A1    Jan. 21, 2016

Related U.S. Application Data

(63) Continuation-in-part of application No. 12/531,775, filed as application No. PCT/DE2008/000453 on Mar. 14, 2008, now abandoned.

(30) Foreign Application Priority Data

Mar. 20, 2007    (DE) ........................ 10 2007 014 276

(51) Int. Cl.
*F24H 3/00*    (2006.01)
*H05K 7/20*    (2006.01)
(Continued)

(52) U.S. Cl.
CPC ............ *H05K 7/20872* (2013.01); *F01P 3/12* (2013.01); *F16H 57/0412* (2013.01);
(Continued)

(58) Field of Classification Search
CPC ..... H05K 7/20872; H05K 5/0082; F01P 3/12; F16H 57/0412; F16H 61/0006; F28F 3/12; F28D 2021/0089
(Continued)

(56) References Cited

U.S. PATENT DOCUMENTS 2,360,123 A    10/1944    Gerstung
2,965,819 A    12/1960    Rosenbaum
(Continued)

FOREIGN PATENT DOCUMENTS

DE    19715592    10/1998
DE    10317580    1/2004
(Continued)

OTHER PUBLICATIONS

Translation of the Official Letter of Provisional Rejection for Japanese Application No. 2009-553-902 dated Jan. 31, 2012.
(Continued)

*Primary Examiner* — Justin Jonaitis
(74) *Attorney, Agent, or Firm* — RatnerPrestia

(57) ABSTRACT

A control unit for use in the engine compartment or in the transmission of a motor vehicle. The control unit has a line section for an engine or transmission fluid, a circuit carrier, and a base plate. The base body is mounted on the base plate. The circuit carrier is arranged between the base body and the base plate. The base body has a plurality of parallel channels each having a respective outlet. At least one of the plurality of parallel channels forms a portion of the line section. A separate cover is mounted on the base body, the cover having a single inlet coupled to the plurality of parallel
(Continued)

channels. The cover is, other than only the inlet, connected to the base body in a fluid-tight manner, and the inlet is the only fluid passage through the cover.

2 Claims, 2 Drawing Sheets

(51) Int. Cl.
| | | |
|---|---|---|
| F28F 3/12 | (2006.01) | |
| F16H 57/04 | (2010.01) | |
| F01P 3/12 | (2006.01) | |
| F16H 61/00 | (2006.01) | |
| H05K 5/00 | (2006.01) | |
| F28D 21/00 | (2006.01) | |

(52) U.S. Cl.
CPC ........... *F16H 61/0006* (2013.01); *F28F 3/12* (2013.01); *H05K 5/0082* (2013.01); *F28D 2021/0089* (2013.01)

(58) Field of Classification Search
USPC ............. 184/6.12, 6.22, 104.1, 104.2, 104.3; 165/47, 41, 80.4, 80.5, 168, 170, 185, 165/80.3, 128, 129, 130, 131; 74/467, 74/606 A
See application file for complete search history.

(56) References Cited

U.S. PATENT DOCUMENTS

| | | | |
|---|---|---|---|
| 3,327,776 A | 6/1967 | Butt | |
| 3,462,553 A | 8/1969 | Spranger | |
| 3,669,812 A | 6/1972 | Ensslin | |
| 4,559,995 A * | 12/1985 | Van der Stuyf | .......... F01P 3/12 123/198 E |
| 4,763,611 A | 8/1988 | Kobayashi | |
| 4,838,041 A | 6/1989 | Bellows | |
| 4,893,590 A * | 1/1990 | Kashimura | ......... F02D 41/3005 123/41.31 |
| 5,099,910 A | 3/1992 | Walpole | |
| 5,316,075 A * | 5/1994 | Quon | ...................... F28F 13/02 165/104.33 |
| 5,504,378 A | 4/1996 | Lindberg | |
| 5,685,361 A | 11/1997 | Demmler | |
| 5,761,037 A | 6/1998 | Anderson | |
| 5,831,409 A | 11/1998 | Lindberg | |
| 5,992,515 A | 11/1999 | Spiegel | |
| 6,058,898 A * | 5/2000 | Freese, V | .......... F01M 11/0004 123/195 C |
| 6,105,373 A | 8/2000 | Watanabe | |
| 6,179,049 B1 * | 1/2001 | Higgins | ................. B21D 28/28 165/140 |
| 6,302,190 B1 * | 10/2001 | Clamp | ................ B60R 16/0239 165/169 |
| 6,865,081 B2 | 3/2005 | Meyer | |
| 7,156,160 B2 | 1/2007 | Lee | |
| 7,916,483 B2 * | 3/2011 | Campbell | .......... H05K 7/20236 165/80.4 |
| 2001/0050162 A1 * | 12/2001 | Valenzuela | ............. F28D 15/00 165/80.4 |
| 2002/0079095 A1 * | 6/2002 | Davies | ................... F02M 31/20 165/170 |
| 2004/0020231 A1 | 2/2004 | Nakamura | |

FOREIGN PATENT DOCUMENTS

| | | |
|---|---|---|
| EP | 1206029 | 5/2002 |
| JP | 09307040 | 11/1997 |
| JP | 11257483 | 9/1999 |
| JP | 2000257705 | 9/2000 |
| JP | 2001193456 | 7/2001 |
| JP | 2003008264 | 1/2003 |
| JP | 20046811 | 1/2004 |
| JP | 2004245318 | 9/2004 |
| JP | 2005180620 | 7/2005 |
| JP | 2006108601 | 4/2006 |
| JP | 2006521025 | 9/2006 |
| WO | 9535019 | 12/1995 |
| WO | 9846457 | 10/1998 |
| WO | 2004007972 | 1/2004 |
| WO | 2004079792 | 9/2004 |

OTHER PUBLICATIONS

Entire patent prosecution history of U.S. Appl. No. 12/531,775, filed, Sep. 17, 2009, entitled, "Control Appliance For Using In The Engine Compartment Or In The Transmission Of A Motor Vehicle And Cooling System For Such A Control Appliance."

* cited by examiner

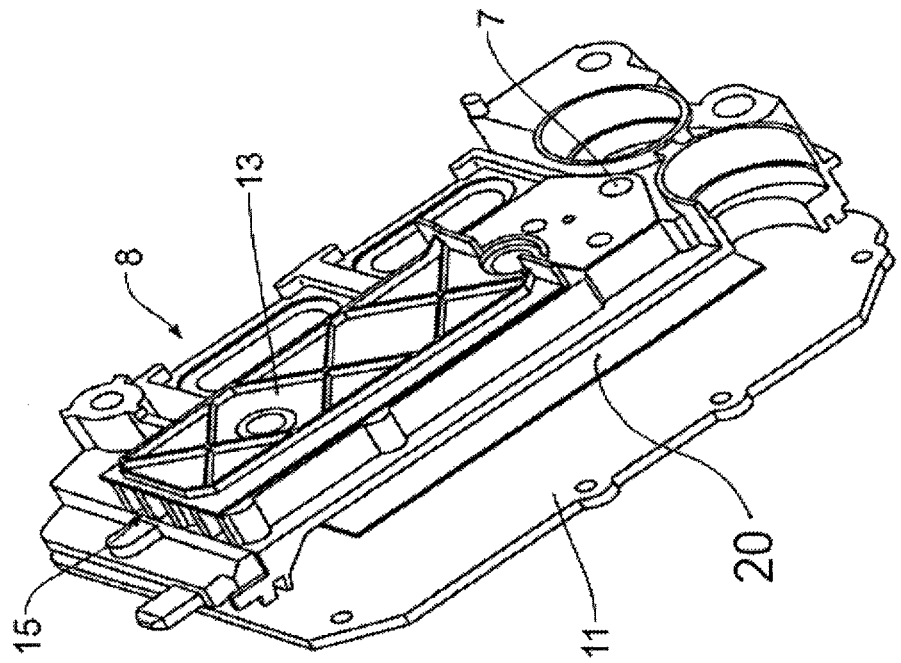
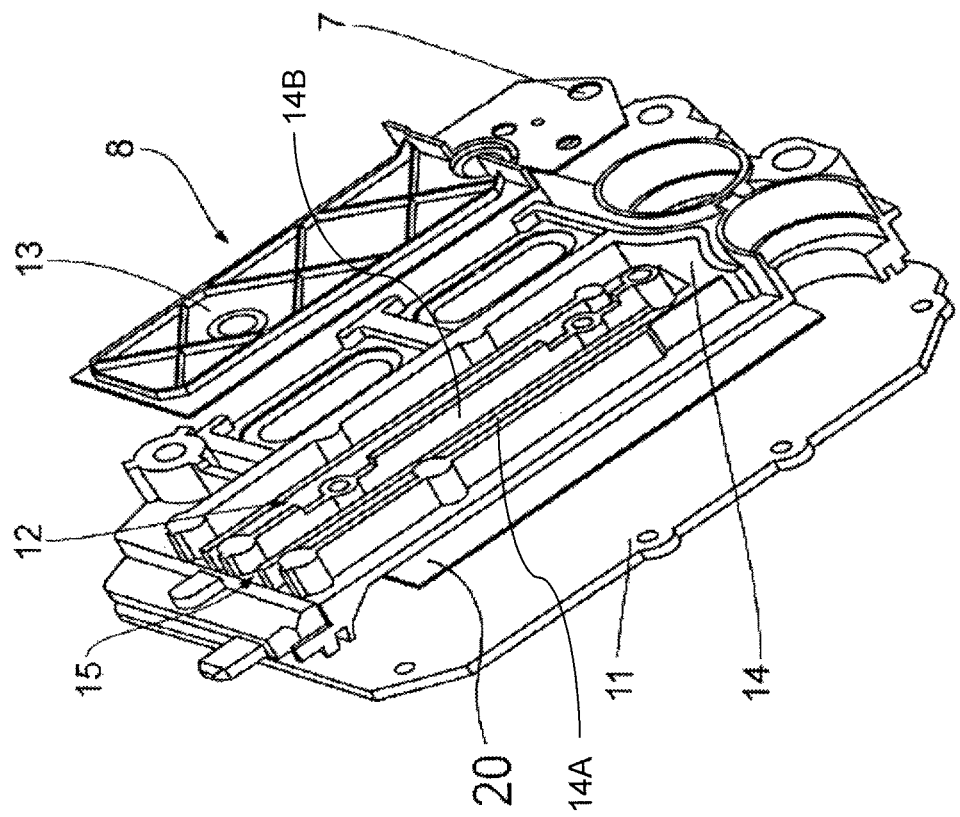

US 9,743,563 B2

CONTROL APPLIANCE FOR USING IN THE ENGINE COMPARTMENT OR IN THE TRANSMISSION OF A MOTOR VEHICLE AND COOLING SYSTEM FOR SUCH A CONTROL APPLIANCE

CROSS REFERENCE TO RELATED APPLICATIONS

This application is a continuation-in-part of application Ser. No. 12/531,775, filed Sep. 17, 2009, which is the U.S. national phase application of PCT International Application No. PCT/DE2008/000453, filed Mar. 14, 2008, which claims priority to German Patent Application No. DE 10 2007 014 276.7, filed Mar. 20, 2007, the contents of such applications being incorporated by reference herein.

BACKGROUND OF THE INVENTION

1. Field of the Invention

The invention relates to a control device for use in the engine compartment or in the transmission of a motor vehicle. Furthermore, the invention relates to a cooling arrangement for such a control device.

2. Description of the Related Art

In automobile engineering control devices, in particular engine control devices or transmission control devices, are mounted on-site at the engine or in the transmission in order to save place. Thus, the requirements to the control devices are very high, when it comes to their tightness, mechanical robustness and temperature endurance. With known engines transmission oil achieves temperatures up to for example 155° C.

SUMMARY OF THE INVENTION

An aspect of the present invention cools electronic components in control devices, which are exposed to such temperatures, such that a pre-determined temperature limit for the electronic components is not exceeded.

According to aspects of the invention it was recognized that engine or transmission fluid, in particular oil, which is present in an engine or transmission fluid reservoir of a motor vehicle engine, has a temperature, which lies clearly below the temperature limit for typical electronic components. Such engine or transmission fluid can be guided via the line section for the engine or transmission fluid. Due to the thermal coupling to the housing section for the control unit comprising the electronic components tempering of the control unit is ensured, which keeps the temperature of the control unit below its temperature limit. A failure of the control unit caused by higher temperatures is thus safely prevented. The expenditure for a passive cooling of the control device can be reduced or totally avoided. A cooling of the engine or transmission fluid for ensuring that this fluid in the line section has a sufficient low temperature, can be achieved by a corresponding guidance of the fluid over a sufficient long fluid path, in which the fluid has sufficient occasion to release heat. Such a fluid path can be designed in particular in spiral form.

At least one embodiment of the invention enables a compact housing arrangement with the line section.

A design of the line section according at least one aspect of the invention allows for a cost-efficient embodiment of it and for a simple assembly. The base body of the line section can simultaneously represent the base plate, what again increases the compactness of the structure of the housing of the control device.

Materials for the base body and/or the cover according to one or more embodiments of the invention turned out to be particularly suitable for the guidance of engine or transmission fluid with a typical temperature of 120° C.

The advantages of a cooling arrangement according to one or more aspects of the invention correspond to those, which were already explained above while referring to the control device. The engine or transmission fluid pump ensures a safe and in particular steady flow of engine or transmission fluid through the line section of the housing of the control device.

A fluid cooling device according to one or more embodiments of the invention ensures a further cooling effect by the engine or transmission fluid, so that the fluid can enter the line section of the housing of the control device with again lower temperature.

As a cooling engine or transmission fluid preferably the oil usually present in the engine compartment or in the transmission can be used.

BRIEF DESCRIPTION OF THE DRAWINGS

An example of embodiment of the invention is described in the following on the basis of the drawing, in which

FIG. 2 shows in a perspective exploded view components of a transmission control device for use in the engine compartment of the motor vehicle according to FIG. 1; and FIG. 3 shows the components of the transmission control device according to FIG. 2 with a mounted cover.

DETAILED DESCRIPTION OF THE PREFERRED EMBODIMENT

Figure 1:
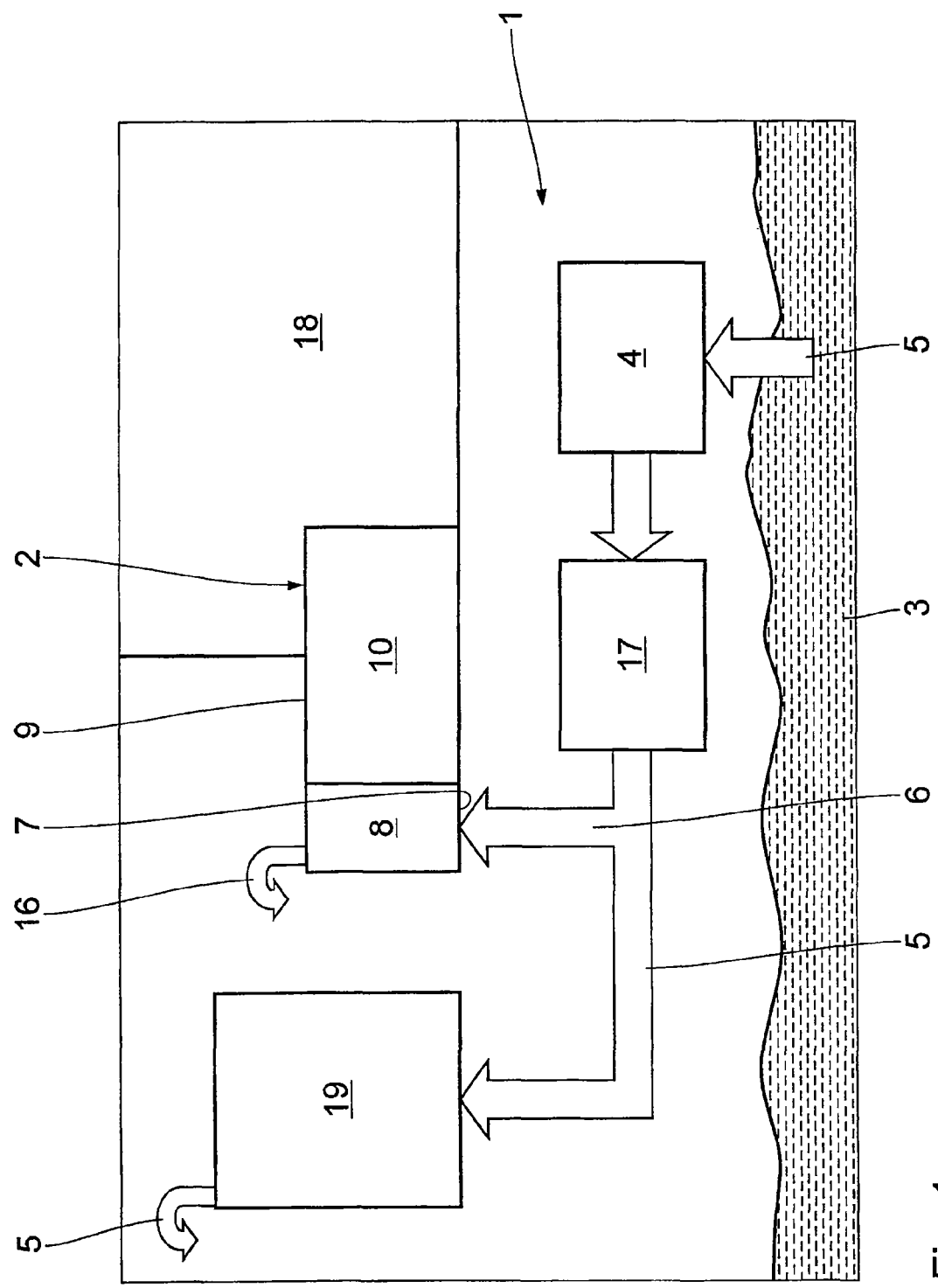
FIG. 1 shows schematically an oil circulation with components of a motor vehicle belonging thereto.

FIG. 1 shows schematically an oil circulation 1 of a motor vehicle. A part of the oil circulation 1 serves as a cooling arrangement for a control device 2, which is used in an engine compartment of the motor vehicle. The control device 2 is in particular a transmission control device. However, the control device 2 can also be used as an engine control device.

The cooling arrangement has a transmission fluid reservoir in form of an oil sump 3. A transmission fluid pump 4 serves for recycling transmission fluid 5 through a transmission fluid circulation schematically shown by arrows in FIG. 1. A transmission fluid supply 6 schematically shown by an arrow in FIG. 1 is connected with an inlet 7 of a line section 8 of a housing 9 of the control device 2. A housing section 10 for a control unit of the control device 2, i.e. in particular for a control electronics, is thermally coupled to the line section 8.

Details for the structure of the line section 8 are shown in FIGS. 2 and 3. Part of the housing 9 is a base plate 11, at which the control unit in the housing section 10 is mounted. The line section 8 is formed section-wise by the base plate 11. Alternatively, the line section 8 can also be placed as a separate part on the base plate 11. The line section 8 is formed in two pieces with a base body 12 and a cover 13. The base plate 11 is a component of the base body 12 and is integrally molded to the latter. A circuit carrier 20 is arranged between base body 12 and base plate 11. The circuit carrier 20 carries or holds a circuit for performing the control functions of control device 2 described herein. The cover 13 is fluid-tight mounted on the base body 12, however, a leakage rate being admissible up to a predetermined tolerance limit. The cover 13 fluid-tight connected to the base body 12 in particular by welding, caulking or screwing. The base body 12 and the cover 13 can be made of aluminum, casting or plastic material.

The inlet 7 is formed in the cover 13 and is fluid connected to a fluid channel portion 14 in the base body 12. At a side of the cover 13 located opposite to the inlet 7 the base body 12 comprises an outlet 15, which is likewise fluid-connected to the channel portion 14.

The fluid channel portion 14 includes a plurality of parallel channels 14A, 14B, each of which has a respective outlet 15. At least one of the plurality of parallel channels 14A, 14B included in fluid channel portion 14 forms a portion of the line section 8. The cover 13 is connected to the base body 12 in a fluid-tight manner with the exception of the opening formed by inlet 7. In other words, the inlet 7 is the only fluid passage through the cover 13.

A transmission fluid discharge 16 outlined in FIG. 1 by a further arrow is fluid-connected to the outlet 15 of the line section 8. The transmission fluid discharge 16 in turn is fluid-connected to the oil sump 3. Between the transmission fluid pump 4 and the inlet 7 a fluid cooling device 17 is arranged.

The shown example of embodiment is a transmission fluid 5, i.e. oil, in particular transmission oil.

The control device 2 is mounted to a transmission 18 schematically represented in FIG. 1. Also the transmission 18 is supplied with the transmission fluid 5. On this occasion; temperatures up to 155° C. appear in the transmission, to which also the control device 2 is exposed. With the transmission fluid 5 furthermore a coupling 19 equally schematically outlined in FIG. 1 is provided.

Cooling of the control device 2 is performed as follows: From the oil sump 3 with the aid of the transmission fluid pump 4 the transmission fluid 5 is transported through the fluid cooling device 17 to the coupling 19. A part of the transported transmission fluid 5 is pumped via the transmission fluid supply 6 into the inlet 7 of the line section 8. The transmission fluid 5 flows through the line section 8 at the housing section 10 of the housing 9 of the control device 2 and flows out from the channel portion 14 through the outlet 15. In order to promote the transmission fluid flow between the inlet and the outlet 15, a chimney effect can be used in the channel portion 14. The leaking transmission fluid 5 returns via the transmission fluid discharge 16 into the oil sump 3. In the oil sump 3 the transmission fluid 5 has a maximum temperature of approx. 120° C., which is not exceeded. This oil, which is cooler compared to the transmission temperatures, thus entails a cooling of the control unit in the housing section 10 of the control device 2. This means that an active transmission fluid cooling, in particular an active oil cooling, is realized.

What is claimed:

1. A control unit for use in the engine compartment or in the transmission of a motor vehicle comprising:
    a line section for an engine or transmission fluid;
    a circuit carrier;
    a base plate;
    a base body mounted on the base plate, whereby the circuit carrier is arranged between the base body and the base plate, and the base body comprises a plurality of parallel channels each having a respective outlet, at least one of the plurality of parallel channels forming a portion of the line section; and
    a separate cover mounted on the base body, the cover having a single inlet coupled to the plurality of parallel channels,
    wherein the cover is, other than only the inlet, directly connected to the base body in a fluid-tight manner by at least one of welding, caulking, or screwing the cover to the base body, and the inlet is the only fluid passage through the cover.

2. A control unit according to claim 1, wherein the base plate and/or the cover are made of aluminum, casting, or plastic material.

* * * * *